US008748871B2

(12) United States Patent
Avouris et al.

(10) Patent No.: US 8,748,871 B2
(45) Date of Patent: Jun. 10, 2014

(54) GRAPHENE DEVICES AND SEMICONDUCTOR FIELD EFFECT TRANSISTORS IN 3D HYBRID INTEGRATED CIRCUITS

(75) Inventors: Phaedon Avouris, Yorktown Heights, NY (US); Josephine B. Chang, Mahopac, NY (US); Wilfried E. Haensch, Somers, NY (US); Fei Liu, Mt. Kisco, NY (US); Zihong Liu, White Plains, NY (US); Yanqing Wu, Ossining, NY (US); Wenjuan Zhu, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 115 days.

(21) Appl. No.: 13/352,737

(22) Filed: Jan. 18, 2012

(65) Prior Publication Data
US 2012/0181510 A1    Jul. 19, 2012

Related U.S. Application Data

(63) Continuation-in-part of application No. 13/009,280, filed on Jan. 19, 2011, now Pat. No. 8,409,957.

(51) Int. Cl.
*H01L 27/088* (2006.01)

(52) U.S. Cl.
USPC ....... 257/29; 257/347; 257/E21.409; 438/287

(58) Field of Classification Search
USPC ............... 438/287; 257/E21.409, 29, 347; 977/734
See application file for complete search history.

(56) References Cited

U.S. PATENT DOCUMENTS

| 6,064,082 | A | 5/2000 | Kawai et al. |
|---|---|---|---|
| 7,247,877 | B2 | 7/2007 | Hakey et al. |
| 7,619,257 | B2 | 11/2009 | Pfeiffer |
| 2009/0114903 | A1 | 5/2009 | Kalburge |
| 2009/0302394 | A1 | 12/2009 | Fujita |
| 2010/0051960 | A1 | 3/2010 | Chen et al. |
| 2010/0055388 | A1 | 3/2010 | Chen et al. |
| 2010/0200839 | A1 | 8/2010 | Okai et al. |
| 2011/0017979 | A1* | 1/2011 | Meric et al. ............ 257/29 |
| 2011/0042687 | A1 | 2/2011 | Chu et al. |
| 2011/0059599 | A1 | 3/2011 | Ward et al. |
| 2011/0215300 | A1 | 9/2011 | Guo et al. |
| 2011/0284818 | A1 | 11/2011 | Avouris et al. |
| 2012/0181506 | A1* | 7/2012 | Farmer et al. ............ 257/29 |

OTHER PUBLICATIONS

F. Schwierz, "Graphene Transistors," Nature Nanotechnology, vol. 5, Jul. 2010, Review Article Published Online May 30, 2010, Copyright 2010 Macmillan Publishers Limited, pp. 487-496.
H. Lin et al., "A Compact Single-Walled Carbon Nanotube Transistor Integrated with a Silicon MOSFET Using a Single Common Gate," Mater. Res. Soc.-Symp. Proc. vol. 963, Copyright 2007 Materials Research Society, 0963-Q14-04.
J. Baliga, "Chips Go Vertical," IEEE Spectrum, Mar. 2004, NA, pp. 43-47, downloaded May 17, 2010 from IEEE Xplore.

(Continued)

*Primary Examiner* — Charles Garber
*Assistant Examiner* — Stanetta Isaac
(74) *Attorney, Agent, or Firm* — Cantor Colburn LLP; Vazken Alexanian

(57) ABSTRACT

A three-dimensional integrated circuit includes a semiconductor device, an insulator formed on the semiconductor device, an interconnect formed in the insulator, and a graphene device formed on the insulator.

8 Claims, 14 Drawing Sheets

(56) References Cited

OTHER PUBLICATIONS

T. Cohen-Karni et al., "Graphene and Nanowire Transistors for Cellular Interfaces and Electrical Recording," Nano Lett. 2010, Copyright 2010 American Chemical Society, Published on Web: Feb. 5, 2010, pp. 1098-1102.

Office Action—Non-Final for U.S. Appl. No. 13/009,280; Filing Date: Jan. 19, 2011; First Named Inventor: Josephine B. Chang; Mailing Date: Jul. 13, 2012.

Office Action—Restriction/Election for U.S. Appl. No. 13/009,280; Filing Date: Jan. 19, 2011; First Named Inventor: Josephine B. Chang; Mailing Date; Mar. 21, 2012.

* cited by examiner

GRAPHENE DEVICES AND SEMICONDUCTOR FIELD EFFECT TRANSISTORS IN 3D HYBRID INTEGRATED CIRCUITS

CROSS-REFERENCE TO RELATED APPLICATIONS

This is a continuation-in-part application of application Ser. No. 13/009,280, filed Jan. 19, 2011.

FIELD OF INVENTION

The present invention relates to hybrid integration of heterogeneous field effect devices for integrated circuits, and more specifically, to 3-D hybrid integration of graphene field-effect transistors and semiconductor based devices.

DESCRIPTION OF RELATED ART

Graphene field effect transistor (FET) devices include a layer of graphene material that results in a device having high charge carrier mobility. These devices exhibit promise in high-frequency, e.g. radio-frequency, electronic applications.

The performance properties of graphene devices suggest that such devices may be useful when used in integrated circuits.

BRIEF SUMMARY

According to one embodiment of the present invention, a three-dimensional integrated circuit includes a semiconductor device, an insulator formed on the semiconductor device, an interconnect formed in the insulator, and a graphene device formed on the insulator.

According to another embodiment of the present invention, a multi-layer integrated circuit includes a semiconductor device, a first insulator formed on the semiconductor device, a first interconnect formed in the first insulator, a first graphene device formed on the first insulator, a second insulator formed on the graphene device, a second interconnect formed in the second insulator, and a second graphene device formed on the second insulator.

According to yet another embodiment of the present invention, a multi-chip integrated circuit includes a first three-dimensional integrated circuit, an insulator, a second three-dimensional integrated circuit, and through wafer vias to connect the first three-dimensional integrated circuit and the second three-dimensional integrated circuit.

According to yet another embodiment of the present invention, method for forming a three-dimensional integrated circuit includes forming a semiconductor device, forming a dielectric layer on the semiconductor device, forming a conductive interconnect portion in a dielectric layer, and forming a graphene device on the dielectric layer.

According to yet another embodiment of the present invention, a method for forming a multi-chip integrated circuit includes forming a first three-dimensional integrated circuit, forming insulator layer on the first three-dimensional integrated circuit, forming a second three-dimensional integrated circuit on the insulator, forming an through wafer vias between the first and the second three-dimensional integrated circuits.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 2 illustrates the formation of a semiconductor FET device;

FIG. 3 illustrates the formation of the first insulator layer and first contact vias;

FIG. 4 illustrates the formation of the second insulator layer and interconnects;

FIG. 5 illustrates the formation of a third insulator layer and the second contact vias;

FIG. 6 illustrates the formation of graphene channel, source region and drain region;

FIG. 7 illustrates the formation of a dielectric layer; and

FIG. 8 illustrates the formation of a conductive gate material.

FIG. 10 illustrates the formation of a semiconductor FET device;

FIG. 11 illustrates the formation of the first insulator layer and the first contact vias;

FIG. 12 illustrates the formation of the second insulator layer and interconnects;

FIG. 13 illustrates the formation of the third insulator layer and the second contact vias;

FIG. 14 illustrates the formation of the fourth insulator layer and local back gate;

FIG. 15 illustrates the formation of thin gate dielectrics and the formation of the third contact vias.

FIG. 16 illustrates the formation of the graphene channel, source region and drain regions.

FIG. 18 illustrates the formation of a semiconductor device, insulator and interconnect, and back-gate graphene device; and FIG. 19 illustrates the formation of a gate dielectric on graphene and top-gate electrode.

DETAILED DESCRIPTION

Integrated circuits may be formed on a wafer using a variety of complimentary metal oxide semiconductor (CMOS)

fabrication methods that form semiconductor based FET devises. Recently, a number of methods have been developed for fabricating graphene FET devices. Forming both semiconductor FET devices and graphene devices on a wafer in an integrated circuit offers increased performance benefits.

Figure 1:
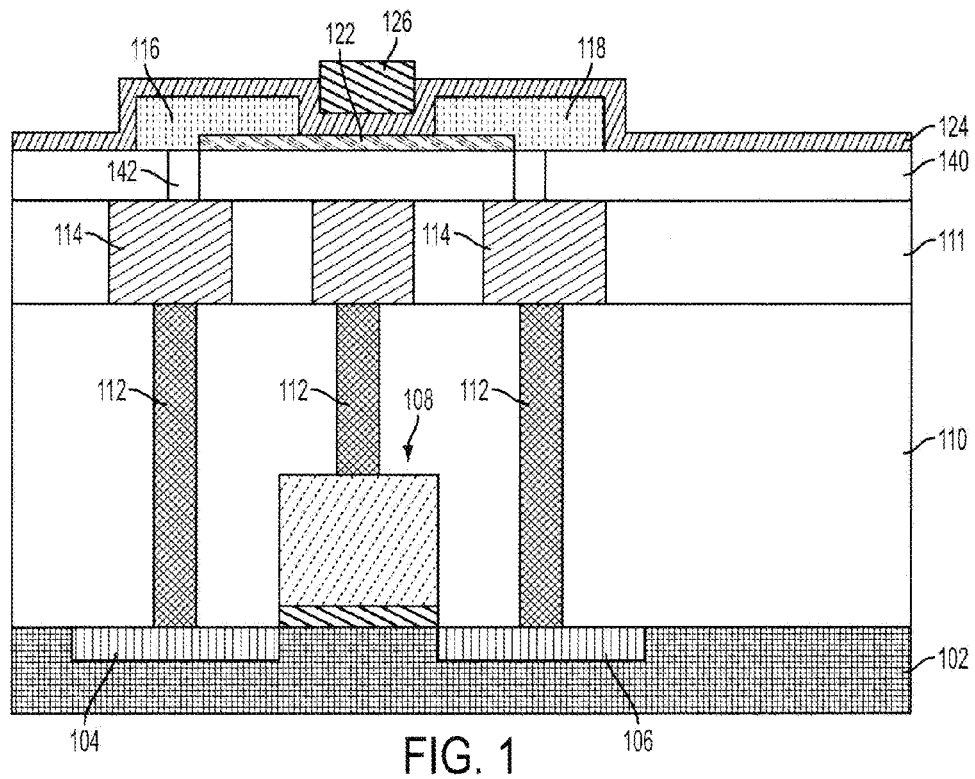
FIG. 1 illustrates an exemplary embodiment of a portion of a 3-D hybrid integrated circuit including a top-gated graphene FET.

FIG. 1 illustrates an exemplary embodiment of a portion of an integrated circuit 100 including a top-gated graphene FET device 103. The circuit portion 100 includes a wafer substrate (substrate) 102. The substrate 102 may include, for example, a semiconductor material such as, SiC, Ge, SiGe or a group III-V semiconductor material. A semiconductor FET device 101, such as, for example, a metal oxide semiconductor FET (MOSFET) or other type of semiconductor FET device, is disposed on the substrate 102. The device 101 includes a source region 104 and a drain region 106 that may include, for example, ion doped semiconductor material. A gate stack 108 is disposed between the source region 104 and the drain region 106. The gate stack 108 may include gate dielectrics layer and a gate electrode made by metallic or polysilicon type material. An insulator layer 110 is formed over the source region 104, the drain region 106, the gate stack 108 and the exposed substrate 102. Conductive vias 112 are formed in cavities in the insulator layer 110 that are filled with a conductive material such as, for example, copper or tungsten. The vias 112 may connect the source region 104, the drain region 106, and the gate stack 108 to wide conductive interconnects 114 that are formed in a second insulator layer 111. The third insulator layer 140 is formed on the second insulator layer 111 and the second contact via 142 is formed in insulator 140. The conductive contact vias 142 are connected to a graphene FET device (graphene device) 103 that is disposed on the dielectric layer 140. In the illustrated embodiment, the graphene device 103 includes a graphene layer 122, a conductive source region 116 and a conductive drain region 118, and a gate stack 120 that includes a dielectric layer 124 and a conductive gate material 126.

Figure 2:
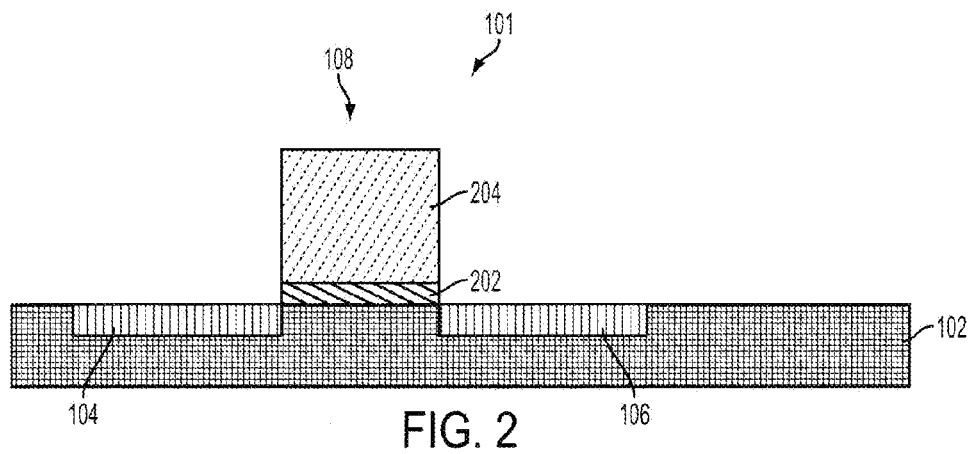
FIGS. 2-8 illustrate side views of an exemplary method for forming a circuit similar to the illustrated embodiment of FIG. 1, in this regard.

FIGS. 2-8 illustrate side views of an exemplary method for forming a device similar to the illustrated embodiment of FIG. 1 described above. Referring to FIG. 2, a semiconductor FET device 101 is fabricated by forming a source region 104 and drain region 106 in the substrate 102. The source and drain regions 104 and 106 may be formed by methods that include, for example, ion implantation or in-situ doping methods. The gate stack 108 is formed on a channel region of the substrate 102 partially defined by the source and drain regions 104 and 106. The gate stack 108 may include a variety of materials selected according to the specifications of the device 101. In the illustrated embodiment a CMOS device includes an oxide material layer 202 and a polysilicon material layer 204. Other embodiments of the device 101 may include, for example, a high-K/metallic gate or other type of FET gate stack structure.

Figure 3:
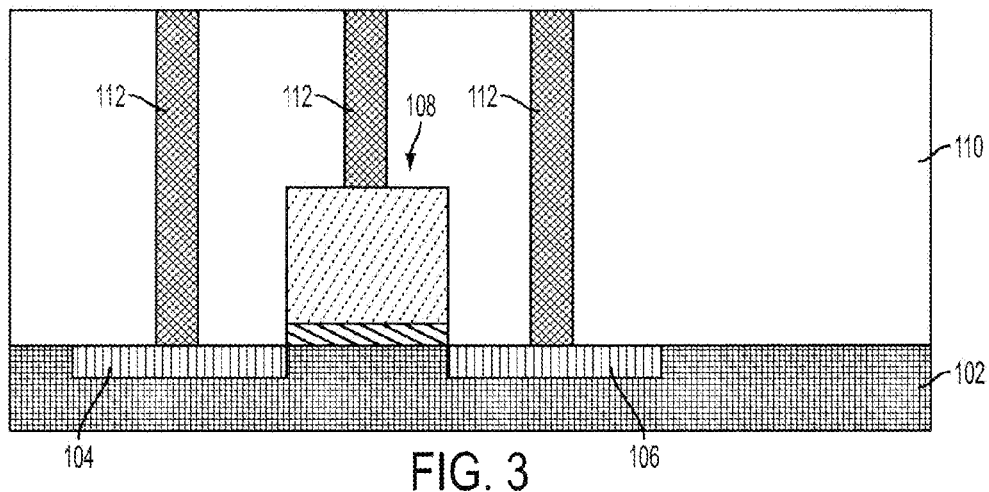

FIG. 3 illustrates the formation of an insulator layer 110 over the device 101 and the exposed substrate 102 using for example, a chemical vapor deposition process. The insulator layer 110 may include thick silicon oxide, for example. Once the insulator layer 110 is formed, via cavities are formed in the insulator layer 110 to expose portions of the source region 104, the drain region 106, and the gate stack 108. The via cavities are filled with a conductive material such as, for example, copper or tungsten resulting in the formation of the vias 112.

Figure 4:
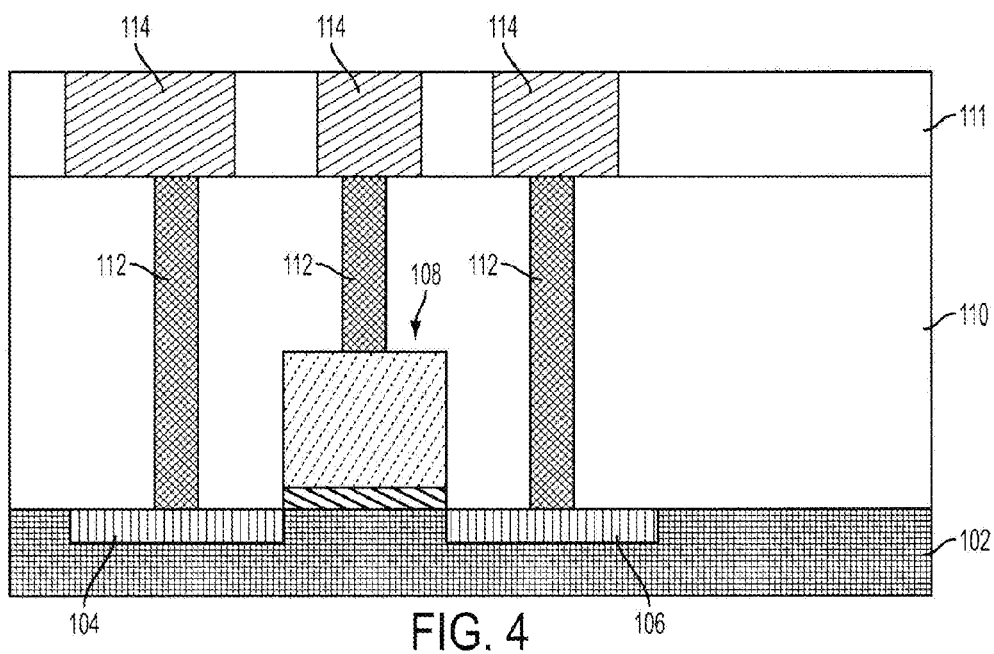

FIG. 4 illustrates the formation of wide conductive interconnects and inductors (interconnects) 114 that are electrically connected to the vias 112. The interconnects 114 may be formed from a metallic material such as, for example, copper or aluminum and are surrounded by the second insulator layer 111.

Figure 5:
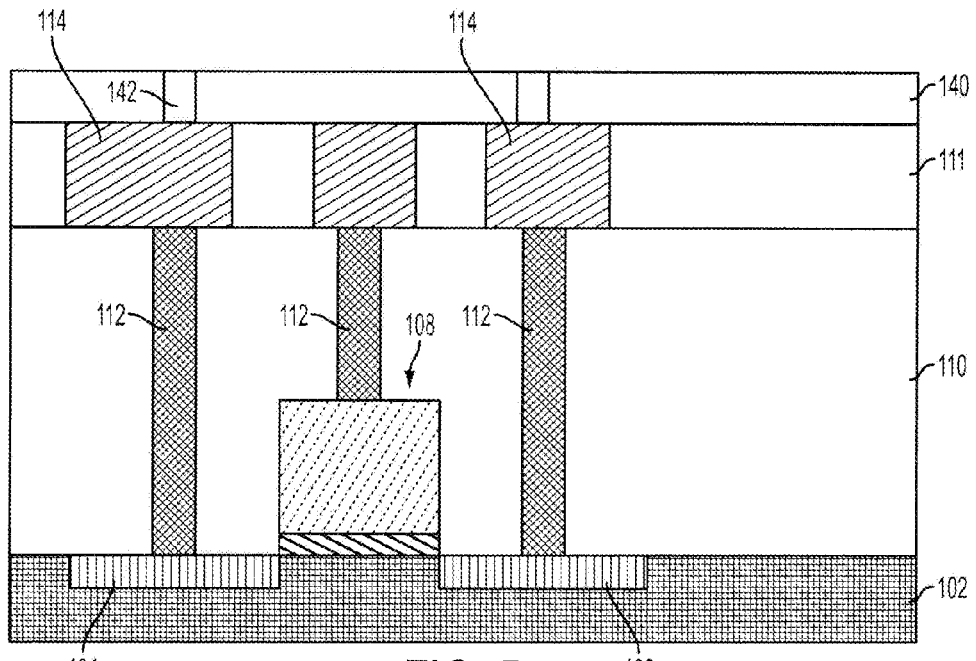

FIG. 5 illustrates the formation of third insulator layer 140 over the insulator layer 111, the second contact vias 142 and formation of a graphene layer 122 on the third insulator layer 140. The graphene layer 122 may be formed by any suitable method, for example, transferring the graphene material from a CVD grown graphene film on a copper foil or another graphene formation process.

Figure 6:
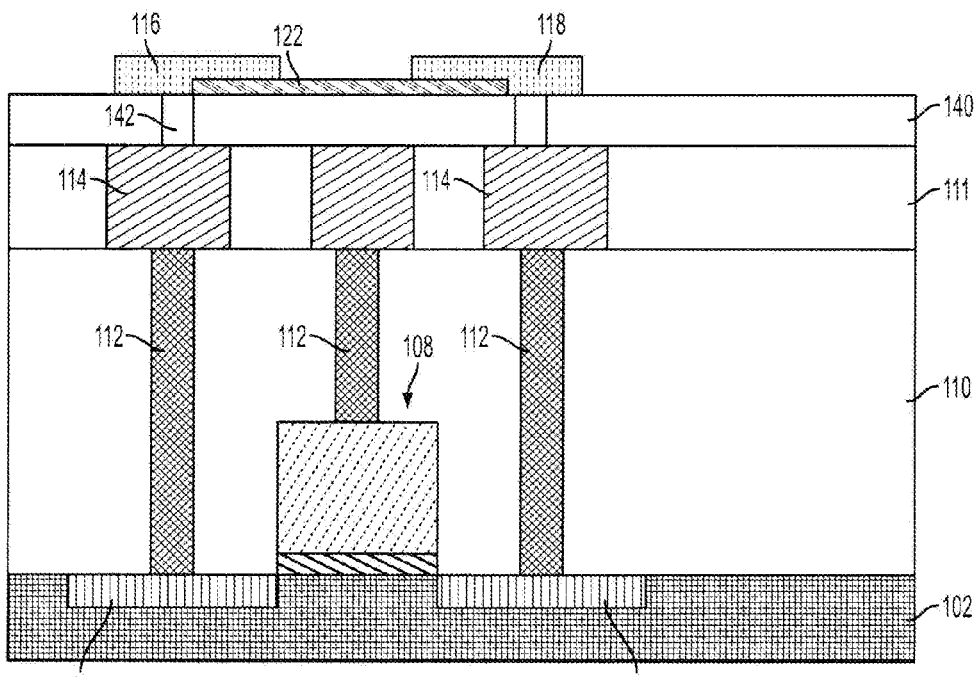

FIG. 6 illustrates the resultant structure following the patterning and etching of the graphene layer 122 using, for example an oxygen plasma process, or other suitable process that removes portions of the graphene layer 122 and defines the graphene layer 122 over the channel region of the device. Following the patterning of the graphene layer 122, a source region 116 and drain region 118 are formed onto the graphene layer 122. The source region 116 and the drain region 118 may electrically contact the corresponding interconnects 114. The source and drain regions 116 and 118 may be formed by, for example, photolithographic patterning and metallic material deposition processes.

Figure 7:
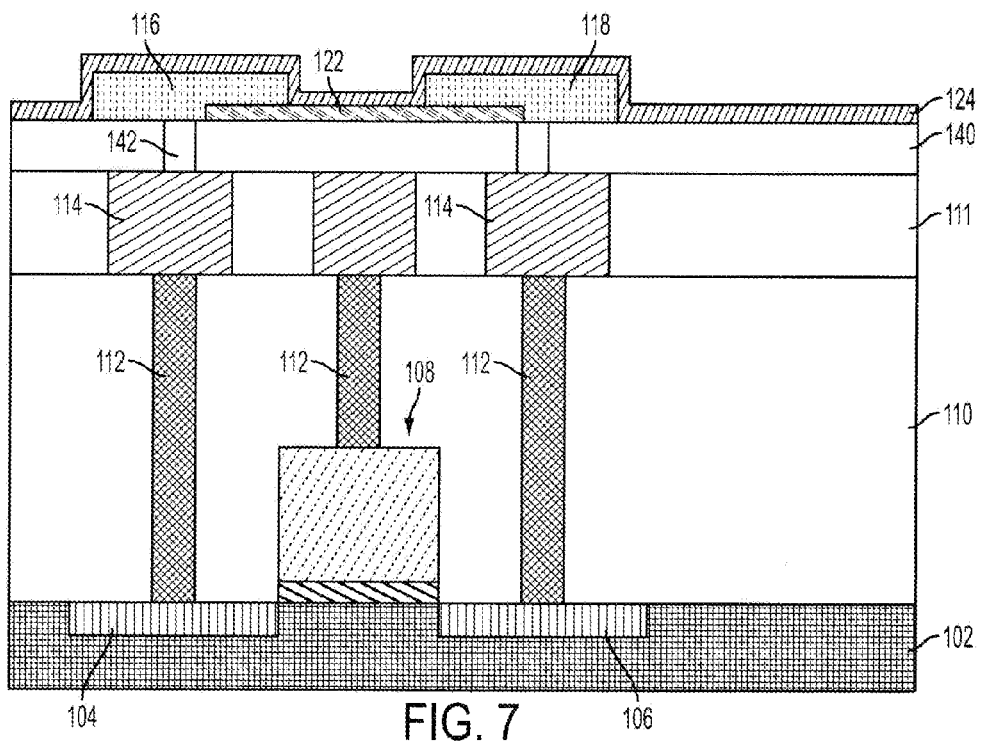

FIG. 7 illustrates the formation of a dielectric layer 124 that may include, for example, a high-K dielectric material. The dielectric layer 124 is formed over the exposed graphene layer 122 and the source and drain regions 116 and 118 using, for example, a chemical vapor deposition process or atomic layer deposition process.

Figure 8:
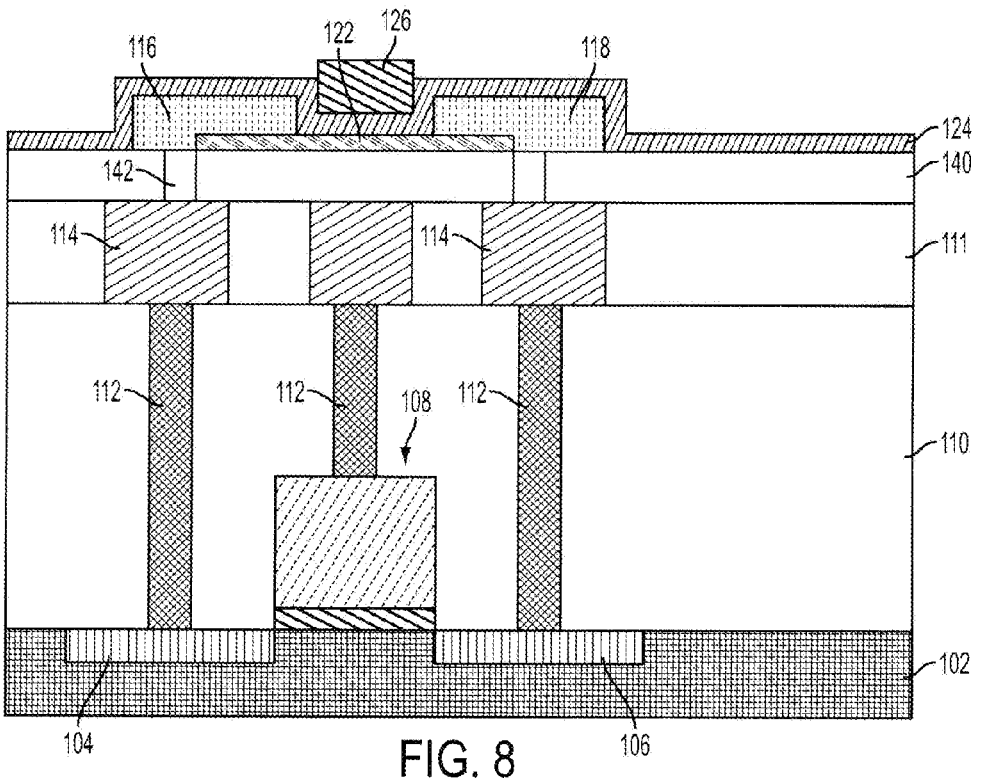

FIG. 8 illustrates the formation of a metallic gate material 126 that is patterned such that the metallic gate material 126 is formed over the dielectric layer 124 in the gate stack region 120 partially defined by the graphene layer 122 of the FET device 103.

Figure 9:
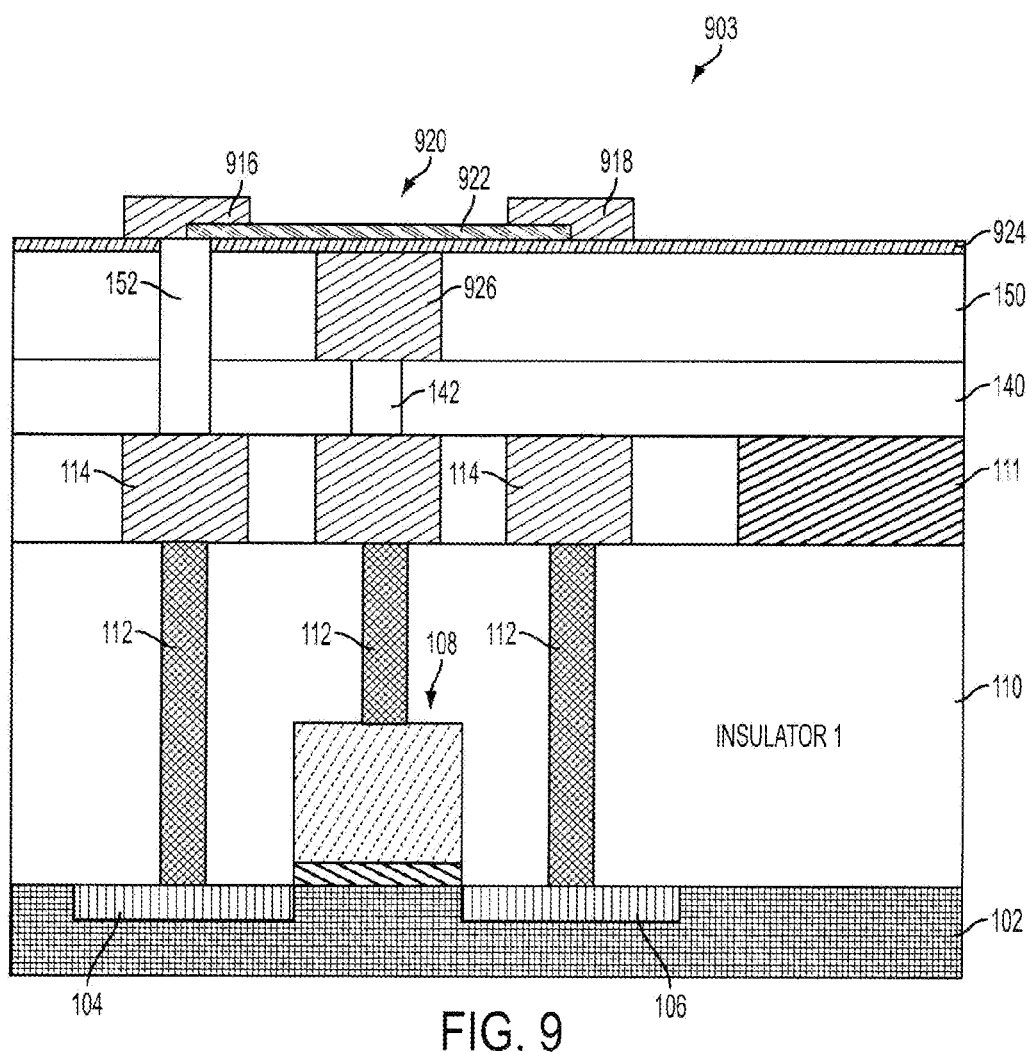
FIG. 9 illustrates an exemplary embodiment of a portion of an integrated circuit device including a back-gated graphene FET.

FIG. 9 illustrates an exemplary embodiment of a portion of an integrated circuit 900 including a back-gated FET device 903. The circuit portion 900 includes a wafer substrate 102. The substrate 102 may include, for example, a semiconductor material such as, SiC, Ge, SiGe, or a group III-V semiconductor material. A semiconductor FET device 101, such as, for example, a metal oxide semiconductor FET (MOSFET) or other type of semiconductor FET device, is disposed on the substrate 102. The device 101 includes a source region 104 and a drain region 106 that may include, for example, ion doped semiconductor material. A gate stack 108 is disposed between the source region 104 and the drain region 106. The gate stack 108 may include a metallic or polysilicon type gate material. An insulator layer 110 is formed over the source region 104, the drain region 106, the gate stack 108 and the exposed substrate 102. Conductive vias 112 are formed in cavities in the insulator layer 110 that are filled with a conductive material such as, for example, copper or tungsten. The vias 112 may connect the source region 104, the drain region 106, and the gate stack 108 to conductive interconnects 114 that are formed in a second insulator layer 111. The third insulator layer 140 is formed on the second insulator layer 111 and the second contact via 142 is formed in insulator 140. The contact vias 142 are connected to a graphene FET device (graphene device) 903 that is disposed on the insulator layer 140. In the illustrated embodiment, the graphene device 903 includes, a metallic gate material 926 formed in the insulator layer 150, a dielectric layer 924, a graphene layer 922 formed on the dielectric layer 924, a conductive source region 916 and a conductive drain region 918. The dielectric layer 924 is disposed on the metallic gate material 926 and the insulator layer 150. The source region 916 and the drain region 918 are electrically connected to the respective interconnects 114 with conductive vias 152 that pass through the insulator layer 150 and 140. The back gate 926 may be electrically connected to the respective interconnects 114 with conductive vias 142 that pass through the insulator layer 140.

Figure 10:
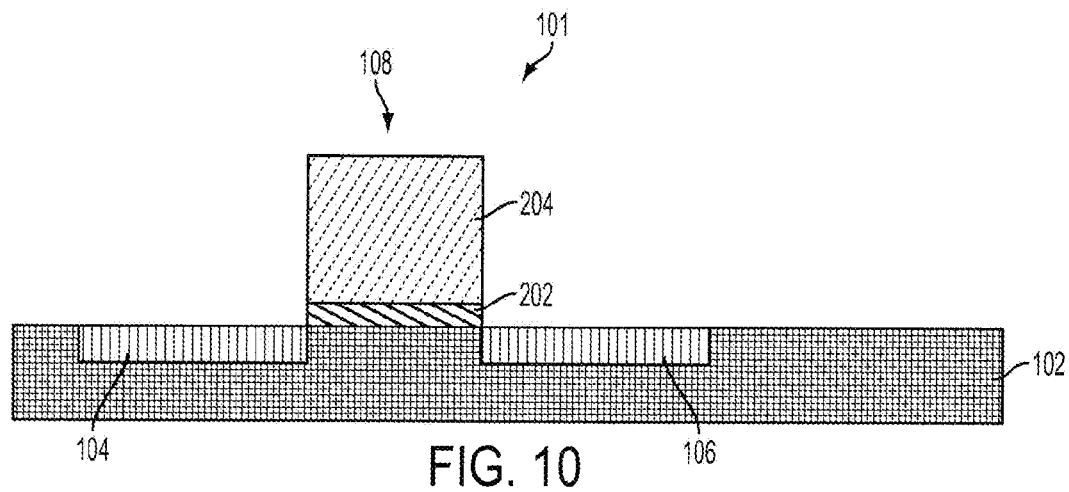
FIGS. 10-16 illustrate side views of an exemplary method for forming a circuit similar to the illustrated embodiment of FIG. 9, in this regard.

FIGS. 10-16 illustrate side views of an exemplary method for forming a device similar to the illustrated embodiment of FIG. 9 described above. Referring to FIG. 10, a FET device 101 is fabricated by forming a source region 104 and drain region 106 in the substrate 102. The source and drain regions 104 and 106 may be formed by methods that include, for example, ion implantation or in-situ doping methods. The gate stack 108 is formed on a channel region of the substrate 102 partially defined by the source and drain regions 104 and 106. The gate stack 108 may include a variety of materials selected according to the specifications of the device 101. In the illustrated embodiment a CMOS device includes an oxide material layer 202 and a polysilicon material layer 204. Other embodiments of the device 101 may include, for example, a metallic gate or other type of FET gate stack structure.

Figure 11:
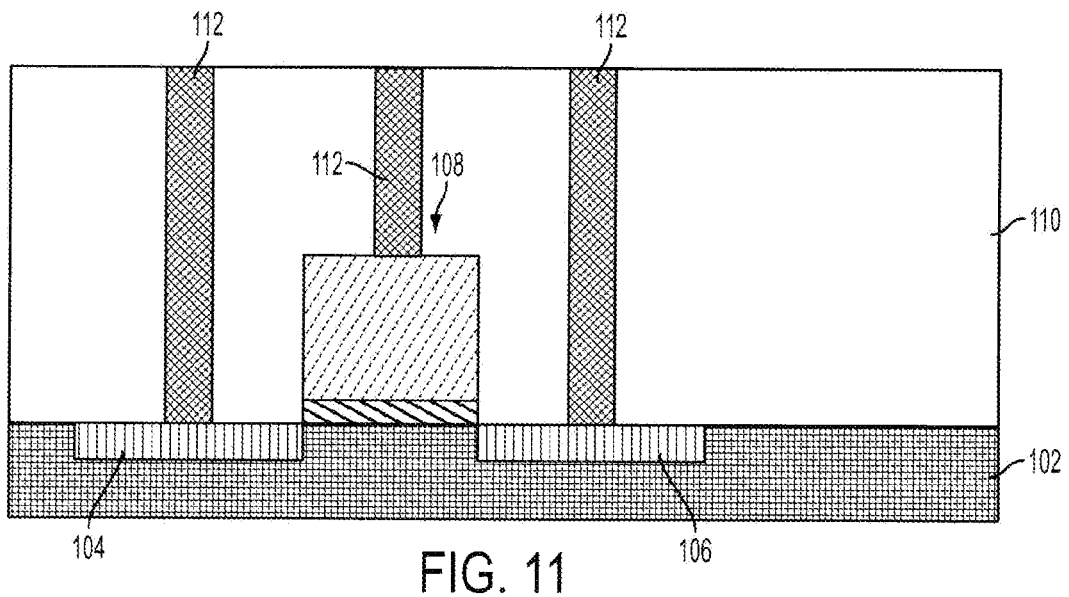

FIG. 11 illustrates the formation of a insulator layer 110 over the device 101 and the exposed substrate 102 using for example, a chemical vapor deposition process. Once the insulator layer 110 is formed, via cavities are formed in the insulator layer 110 to expose portions of the source region 104, the drain region 106, and the gate stack 108. The via cavities are filled with a conductive material such as, for example, copper or aluminum resulting in the formation of the vias 112.

Figure 12:
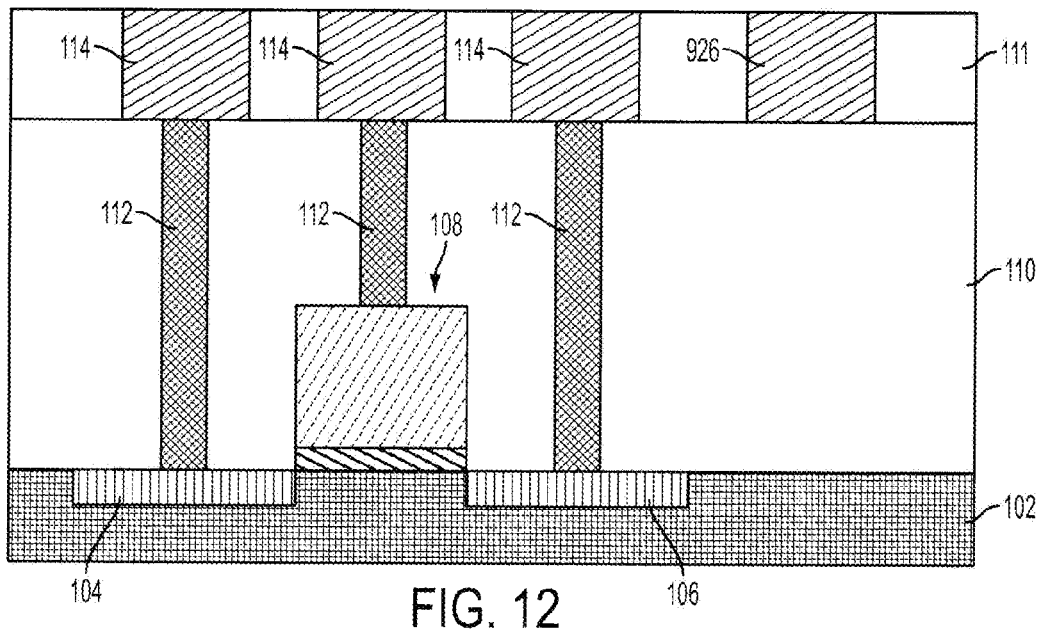

FIG. 12 illustrates the formation of a second insulator layer 111 and conductive interconnects and inductors (interconnects) 114 that are electrically connected to the vias 112. The interconnects 114 may be formed from a metallic material such as, for example, copper or aluminum and are surrounded by the insulator layer 111.

Figure 13:
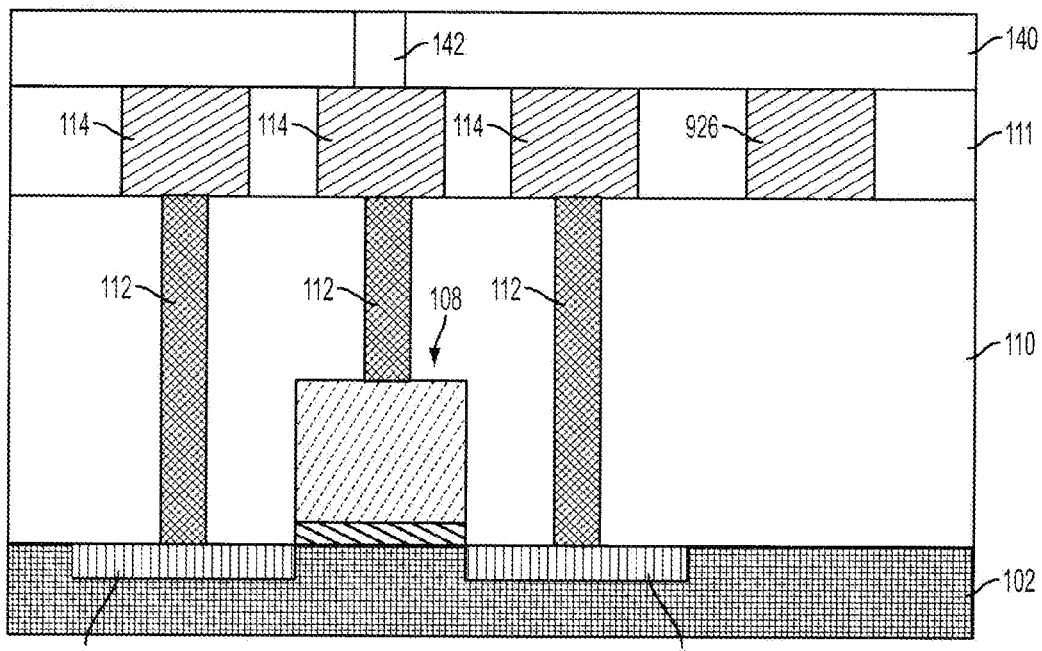

FIG. 13 illustrates the formation of the third insulator layer 140 and contact vias 142 in the third insulator layer 140.

Figure 14:
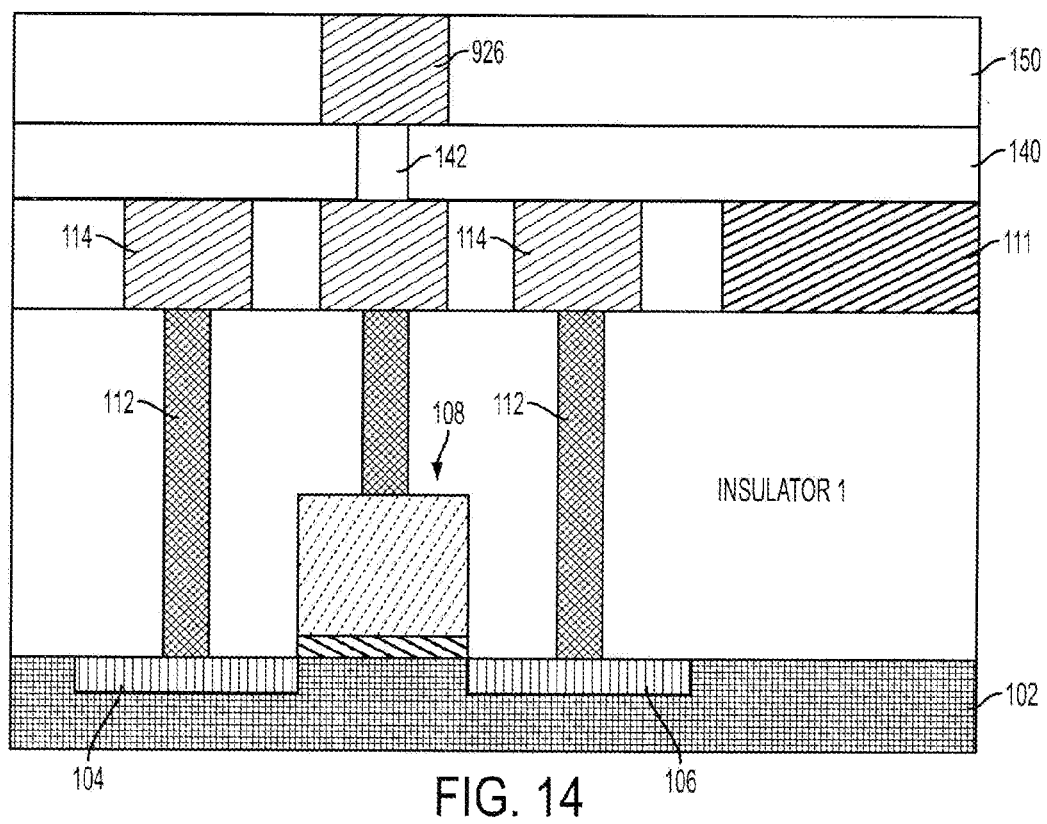

FIG. 14 illustrates the formation of the fourth insulator layer 150 and local back gate 926 in the fourth insulator layer 150.

Figure 15:
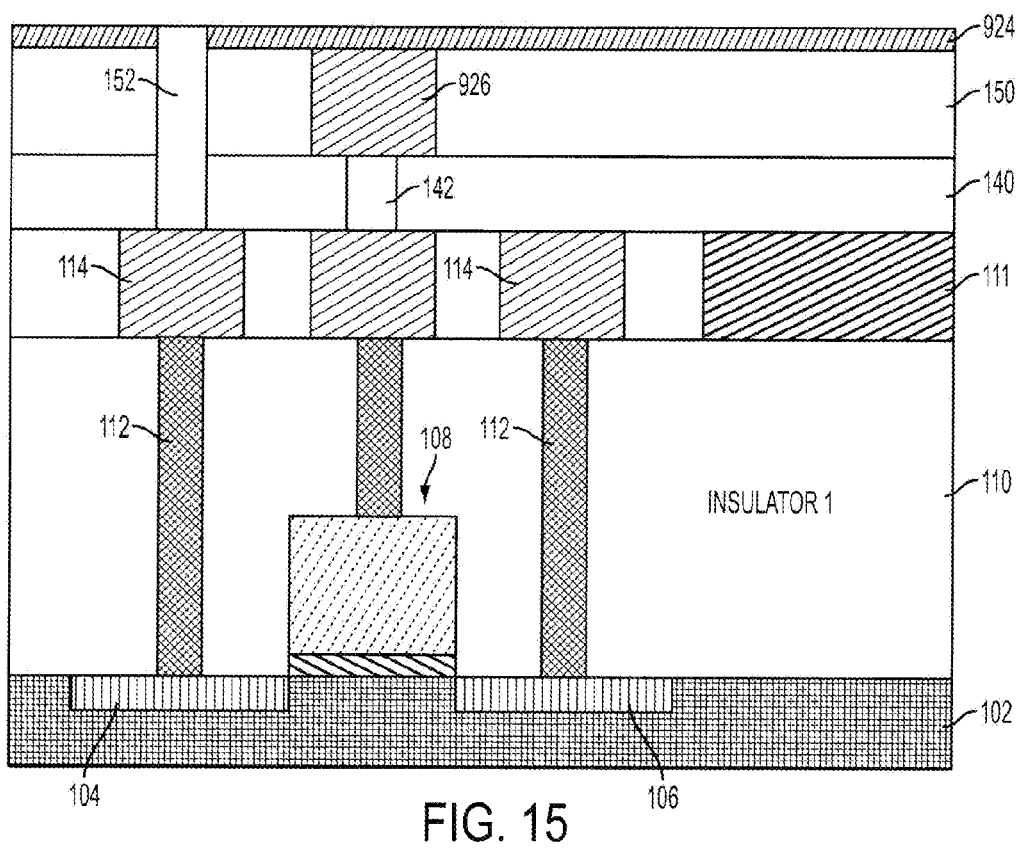

FIG. 15 illustrates the formation of a dielectric layer 924 and formation of conductive vias 152 that pass through the dielectric layer 924, insulator layer 150, insulator layer 140 and contact the interconnects 114. The dielectric layer 924, for example, a high-K layer, is deposited over the metallic gate material 926 and the insulator layer 150.

Figure 16:
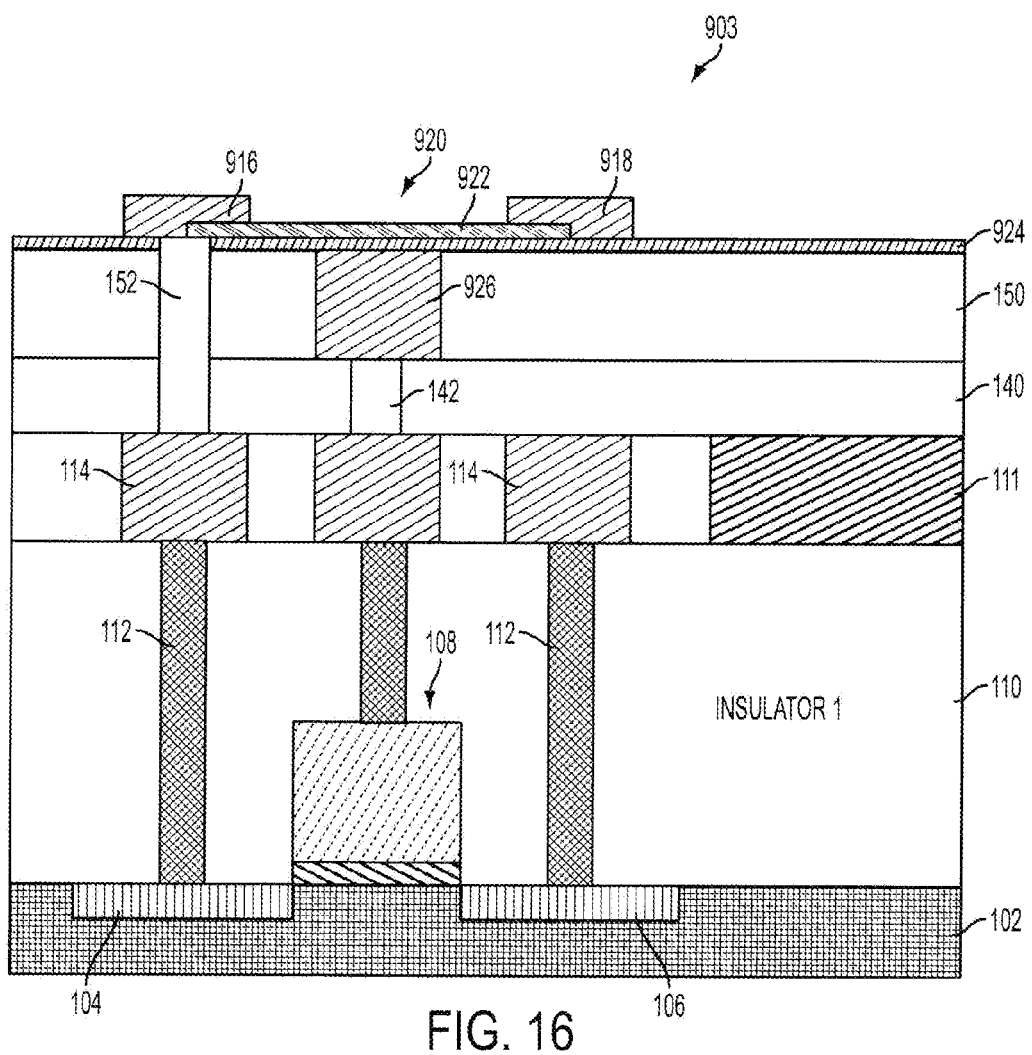

FIG. 16 illustrates the resultant structure following the formation of a graphene layer 922 over the dielectric layer 924, patterning the graphene layer 922, and formation of a source region 916 and drain region 918 that are formed proximate to the graphene layer 922. The graphene layer 922 may be formed by any suitable method, for example, transferring the graphene material from a CVD grown graphene film on a copper foil or another graphene formation process. The illustrated embodiment includes patterning and etching of the graphene layer 922 using, for example, an oxygen plasma process, or other suitable process that removes portions of the graphene layer 922 and defines the graphene layer 922 over the channel region and extends into part of the source and drain regions of the device. The source region 916 and the drain region 918 electrically contact the contact vias 152 which electrically contact the corresponding interconnects 114. The source and drain regions 916 and 918 may be formed by, for example, photolithographic patterning and metallic material deposition processes. The back gate 926 can be electrically connected to the respective interconnects 114 with conductive vias 142 that pass through the insulator layer 140.

Figure 17:
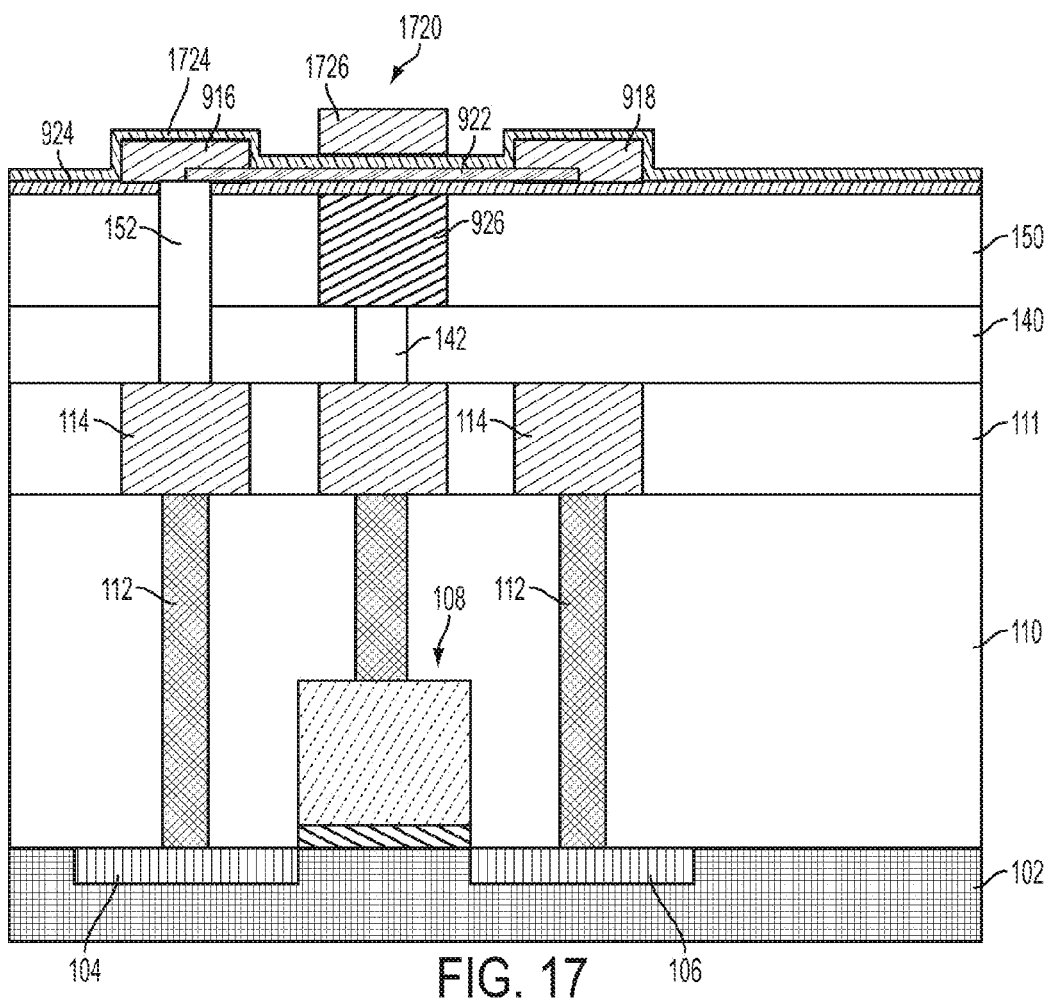
FIG. 17 illustrates an exemplary embodiment of a portion of an integrated circuit including a double-gated graphene FET.

FIG. 17 illustrates an exemplary embodiment of a portion of an integrated circuit device 1700 including a double gated FET device 1703. The device 1700 includes a wafer substrate 102. The substrate 102 may include, for example, a semiconductor material such as, SiC, Ge, SiGe, or a group III-V semiconductor material. A FET device 101, such as, for example, a metal oxide semiconductor FET (MOSFET) or other type of FET device, is disposed on the substrate 102. The device 101 includes a source region 104 and a drain region 106 that may include, for example, ion doped semiconductor material. A gate stack 108 is disposed between the source region 104 and the drain region 106. The gate stack 108 may include a gate dielectric layer 202 and a metallic or polysilicon type gate material 204. An insulator layer 110 is formed over the source region 104, the drain region 106, the gate stack 108 and the exposed substrate 102. Conductive vias 112 are formed in cavities in the insulator layer 110 that are filled with a conductive material such as, for example, copper or tungsten. The vias 112 connect the source region 104, the drain region 106, and the gate stack 108 to conductive interconnects 114 that are formed in the second insulator layer 111. A third insulator layer 140 is formed on the insulator layer 111 and the second contact vias are formed in the insulator 140. A graphene FET device (graphene device) 1703 is disposed on the insulator layer 140. In the illustrated embodiment, the graphene device 1703 includes an insulator 150, a back gate electrode 926, a dielectric layer 924, a graphene layer formed on the dielectric layer 924, a conductive source region 916, a conductive drain region 918, a dielectric layer 1724 and a top gate electrode 1726. The dielectric layer 924 such as a high-k dielectric layer is disposed on the metallic gate material 926, the insulator layer 150. The source region 916 and the drain region 918 are electrically connected to the respective interconnects 114 with conductive vias 152 that pass through the insulator layer 150 and insulator layer 140. The dielectric layer 1724 is formed over the exposed portions of the dielectric layer 924, the source and drain regions 916 and 918 and the graphene layer 922. The top gate electrode 1726 is formed over the dielectric layer 1724, together with the back gate electrode 926, forming a double gate stack.

Figure 18:
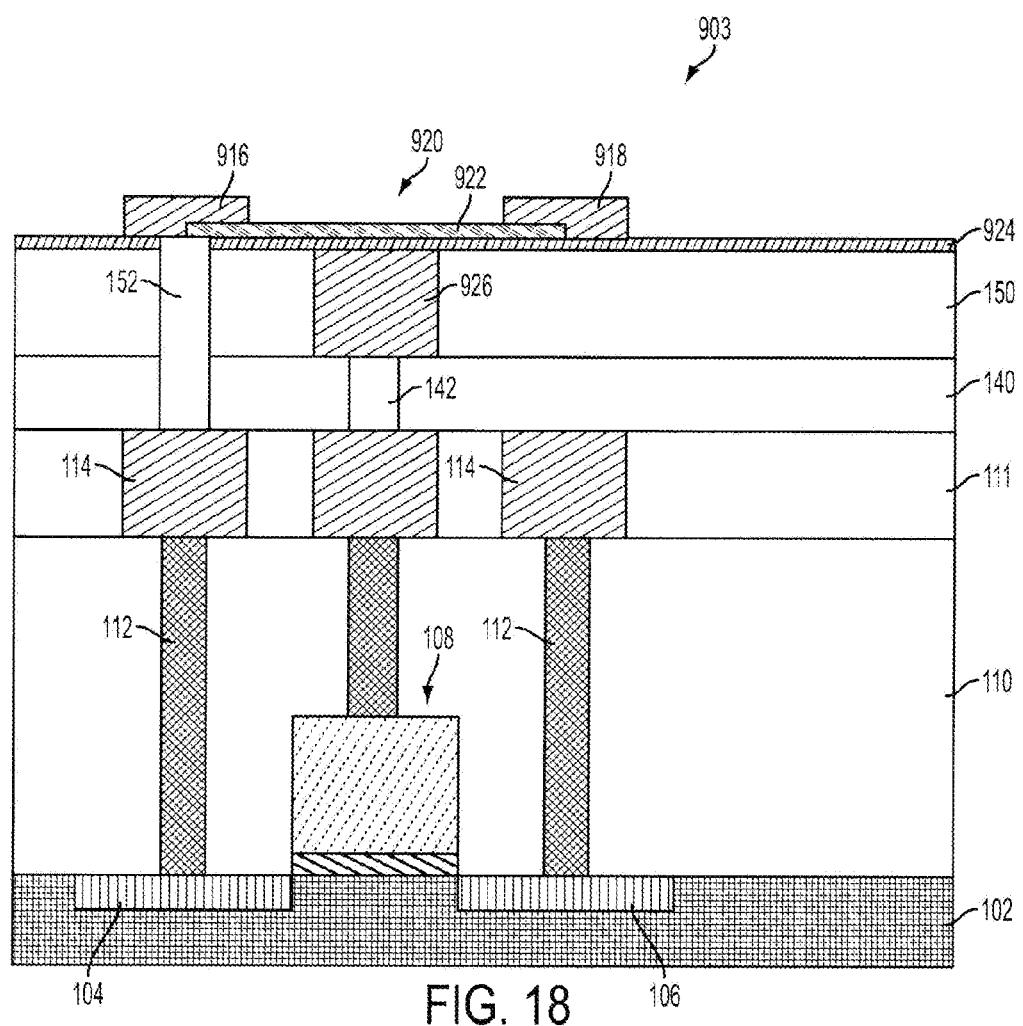
FIGS. 18-19 illustrate side views of an exemplary method for forming a circuit similar to the illustrated embodiment of FIG. 17, in this regard.
Figure 19:
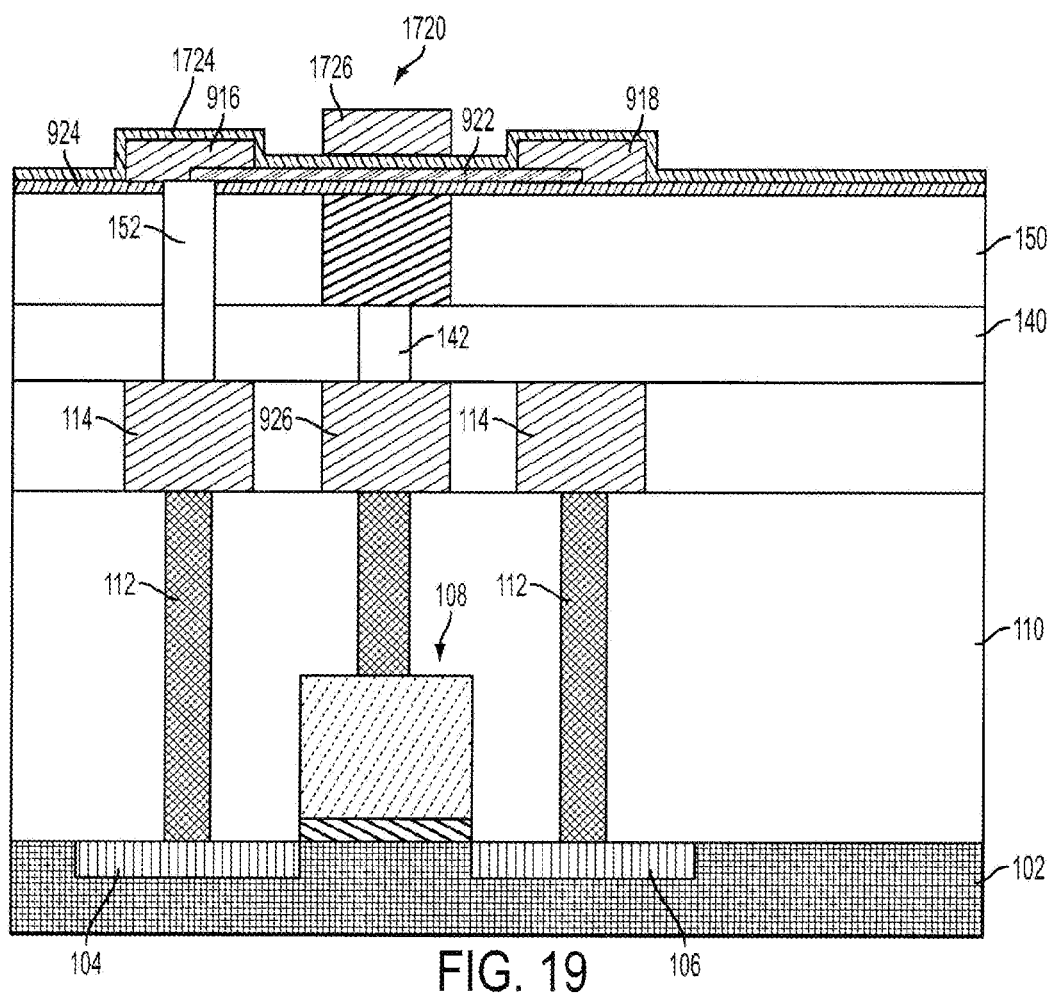

FIGS. 18 and 19 illustrate side views of an exemplary method for forming a device similar to the illustrated embodiment of FIG. 17 described above. In this regard the fabrication methods are similar to the methods described above in FIGS. 10 through 16. Referring to FIG. 17, following the formation of the source and drain regions 916 and 918, a dielectric layer 1724 such as, for example, a high-K layer is formed over the dielectric layer 924, the source and drain regions 916 and 918, and the graphene layer 922.

FIG. 19 illustrates the resultant structure following the formation of a metallic gate material 1726 on the dielectric layer 1724. The metallic gate material 1726 may be formed by, for example, a lithographic patterning and lift-off process.

Figure 20:
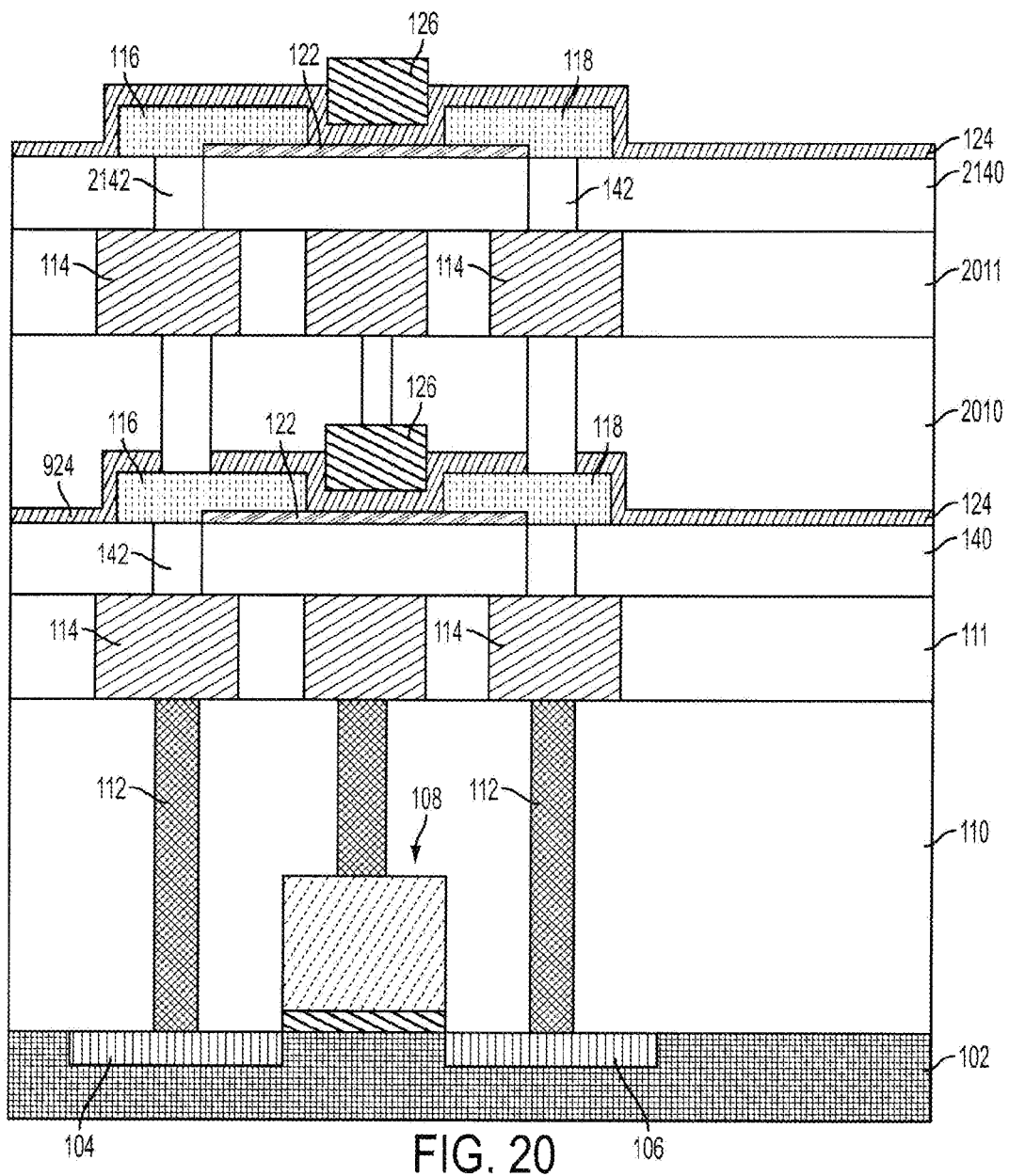
FIG. 20 illustrates an exemplary embodiment of a portion of a multi-layer circuit including a semiconductor device and multiple top-gated graphene devices.

FIG. 20 illustrates an exemplary embodiment of a multi-layer circuit arrangement 2000. In this regard, the integrated circuit 100 including a top-gated graphene FET device 103 is formed in a similar manner as discussed above. Following the formation of the circuit 100, an insulator layer 2010 is formed over the circuit 100. Connective vias 112 are formed in the insulator layer 2010, and another insulator layer 2011 is formed over the dielectric layer 2010. Conductive interconnects 2014 are formed in the dielectric layer 2011. An insulator layer 2140 is formed on top of insulator layer 2011 and the contact vias 2142 is formed in the insulator 2140. A second top-gated graphene FET device 103 is formed on the insulator layer 2140 in a similar manner as discussed above. The illustrated embodiment is but one example of a multi-layer circuit arrangement. Alternative embodiments may include any type of arrangement of graphene devices and FET devices.

The 3-D hybrid integrated circuit structure as described above can be further extended to multi-chip stacking by the through wafer via methods.

The semiconductor device structure mentioned above is for illustrations only. Other detail features may also be added, such as well implant, halo implant, spacer, stress liner etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A three-dimensional integrated circuit comprising:
a semiconductor device;
an insulator formed on the semiconductor device;
an interconnect formed in the insulator; and
a graphene device formed on the insulator, the graphene device comprising:
a first gate electrode formed on the insulator;
a first gate dielectric layer formed on the first gate electrode;
a graphene layer formed on the first gate dielectric layer;
a source region;
a drain region;
a second gate dielectric layer formed on the graphene layer; and
a second gate electrode formed on the second gate dielectric layer.

2. The circuit of claim 1, wherein the semiconductor device comprises:
a semiconductor substrate;
a source region;
a drain region;
a gate dielectric layer disposed on a substrate;
a gate electrode formed on the gate dielectric layer, wherein the insulator is formed on the source region, the drain region, the gate electrode and the semiconductor substrate; and
a contact via formed in the insulator in contact with the source region, the drain region and a gate region.

3. The semiconductor device claim 2, wherein the substrate includes SiC, Ge, SiGe, and III-V materials.

4. The circuit of claim 1, wherein the graphene device comprises:
a graphene layer formed on the insulator,
a source region;
a drain region;
a gate dielectric layer formed on a graphene channel of the graphene device, the source region and the drain region; and
a gate electrode formed on the gate dielectric layer.

5. The circuit of claim 1, wherein the graphene device comprises:
a gate electrode formed on the insulator;
a gate dielectric layer formed on the gate electrode;
a graphene layer formed on the gate dielectric layer,
a source region; and
a drain region.

6. The circuit of claim 1, wherein the interconnect electrically connects the source region, the drain region, and a gate electrode in the semiconductor device to the source region, drain region, and the gate electrode in the graphene device.

7. A multi-layer integrated circuit comprising:
a semiconductor device;
a first insulator formed on the semiconductor device;
a first interconnect formed in the first insulator;
a first graphene device formed on the first insulator;
a second insulator formed on the first graphene device;
a second interconnect formed in the second insulator; and
a second graphene device formed on the second insulator, wherein the second interconnect forms a conductive path between at least one of a first source material first drain material and first gate material of the first graphene device, and at least one of a second source material, second drain material and second gate material of the second graphene device.

8. A multi-chip integrated circuit comprising:
a first three-dimensional integrated circuit, the first three-dimensional integrated circuit comprising:
a semiconductor device;
an insulator layer formed on the semiconductor device;
an interconnect formed in the insulator; and
a graphene device formed on the insulator;
an insulator layer;
a second three-dimensional integrated circuit; and
through wafer vias connecting the first three-dimensional integrated circuit and the second three-dimensional integrated circuit.

* * * * *